(12) United States Patent
Nedovic (10) Patent No.: US 9,509,253 B2
(45) Date of Patent: Nov. 29, 2016

(54) BANDWIDTH IMPROVEMENT FOR AMPLIFIERS

(71) Applicant: FUJITSU LIMITED, Kawasaki-shi, Kanagawa (JP)

(72) Inventor: Nikola Nedovic, San Jose, CA (US)

(73) Assignee: FUJITSU LIMITED, Kawasaki (JP)

( * ) Notice: Subject to any disclaimer, the term of this patent is extended or adjusted under 35 U.S.C. 154(b) by 133 days.

(21) Appl. No.: 14/179,610

(22) Filed: Feb. 13, 2014

(65) Prior Publication Data

US 2015/0229285 A1 Aug. 13, 2015

(51) Int. Cl.
| | |
|---|---|
| H03F 1/34 | (2006.01) |
| H03F 1/08 | (2006.01) |
| H03F 1/42 | (2006.01) |
| H03F 3/08 | (2006.01) |
| H03F 3/195 | (2006.01) |
| H03F 3/30 | (2006.01) |
| H03F 3/45 | (2006.01) |

(52) U.S. Cl.
CPC .............. *H03F 1/086* (2013.01); *H03F 1/347* (2013.01); *H03F 1/42* (2013.01); *H03F 3/087* (2013.01); *H03F 3/195* (2013.01); *H03F 3/3022* (2013.01); *H03F 3/45475* (2013.01); *H03F 2200/117* (2013.01); *H03F 2200/216* (2013.01); *H03F 2200/36* (2013.01); *H03F 2203/45516* (2013.01)

(58) Field of Classification Search
CPC ............................ H03F 2200/117; H03F 3/08
USPC ........... 330/66, 79, 80, 85, 88, 99, 104, 109, 330/166, 182, 254, 258–260, 290, 291, 294, 330/308, 310, 311; 381/315, 320, 355; 375/316; 455/569.1, 412, 556, 557
See application file for complete search history.

(56) References Cited

U.S. PATENT DOCUMENTS

| | | | | |
|---|---|---|---|---|
| 6,836,185 B1* | 12/2004 | Pobanz | ................. | G02F 1/0327 330/260 |
| 7,830,211 B2* | 11/2010 | Cao | ........................ | H03F 1/565 330/302 |
| 2012/0313210 A1* | 12/2012 | Miyatake | .............. | H01L 31/105 257/443 |
| 2014/0016683 A1 | 1/2014 | Jiang | | |
| 2014/0126622 A1 | 5/2014 | McLeod et al. | | |
| 2014/0291487 A1 | 10/2014 | Laforce | | |
| 2014/0365156 A1 | 12/2014 | Abdelmoneum et al. | | |
| 2015/0145597 A1 | 5/2015 | Huang et al. | | |

OTHER PUBLICATIONS

Lou Frenzel, "Back to Basics: Impedance Matching (Part 1)", Oct. 24, 2011, Electronic Design Magazine.*
Lou Frenzel, "Back to the Basics: Impedance Matching (Part 1)", Oct. 24, 2011, Electronic Design Magazine.*
J.Proesel, et al., "25Gb/s 3.6pJ/b and15Gb/s 1.37pJ/b VCSEL-based Optical Links in 90nm CMOS," ISSCC DIG.Tech. Papers, pp. 418-420, Feb. 2012.

* cited by examiner

*Primary Examiner* — Steven J Mottola
*Assistant Examiner* — Hafizur Rahman
(74) *Attorney, Agent, or Firm* — Maschoff Brennan (57) ABSTRACT

A circuit may include an amplifying circuit and a t-coil inductor. The amplifying circuit may include an input node, an output node, an amplifier, and a feedback loop. The feedback loop may be coupled between the input node and the output node. The amplifying circuit may be configured to receive a current signal on the input node and to output a voltage signal based on the current signal on the output node. The t-coil inductor may include a first portion and a second portion. A first node of the first portion may be coupled to the input node of the amplifying circuit and the second portion may be included in the feedback loop.

16 Claims, 6 Drawing Sheets

BANDWIDTH IMPROVEMENT FOR AMPLIFIERS

FIELD

The embodiments discussed herein are related to bandwidth improvement for amplifiers.

BACKGROUND

When receiving high-speed signals, an amplifier's input may suffer from impedance mismatch with a transmission line that supplies the high-speed signals to the amplifier's input. The impedance mismatch may be due to differences in an impedance of the transmission line and an impedance of the amplifier's input. The impedance mismatch may cause one or more signal reflections of the high-speed signals that may result in signal loss and may distort incoming data. The result of signal reflections on signals may be quantified as a return loss of the signals. The amount of return loss in amplifiers may vary based on the transmission line, the amplifier design, and the frequency of the signals being transmitted.

An amplifier may also amplify high-speed signals. The ability of an amplifier to amplify a high-speed signal may be related to a bandwidth of the amplifier. Larger bandwidths of an amplifier may allow for higher-speed signals to be properly amplified by the amplifier.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include an amplifying circuit and a t-coil inductor. The amplifying circuit may include an input node, an output node, and a feedback loop. The feedback loop may be coupled between the input node and the output node. The amplifying circuit may be configured to receive a current signal on the input node and to output a voltage signal based on the current signal on the output node. The t-coil inductor may include a first portion and a second portion. A first node of the first portion may be coupled to the input node of the amplifying circuit and the second portion may be included in the feedback loop.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to an aspect of an embodiment, a circuit is disclosed that includes a transimpedance amplifier with an extended input impedance bandwidth and an extended transimpedance bandwidth. The extended bandwidths of the transimpedance amplifier may be a result of the circuit including a t-coil inductor that is coupled to the transimpedance amplifier. The t-coil inductor may include first and second portions. The first portion of the t-coil inductor may be included in a feedback loop of the transimpedance amplifier and may help to extend the transimpedance bandwidth of the transimpedance amplifier. The second portion of the t-coil inductor may be coupled to an input node of the transimpedance amplifier and may help to extend the input impedance bandwidth of the transimpedance amplifier.

Embodiments of the present invention will be explained with reference to the accompanying drawings.

Figure 1:
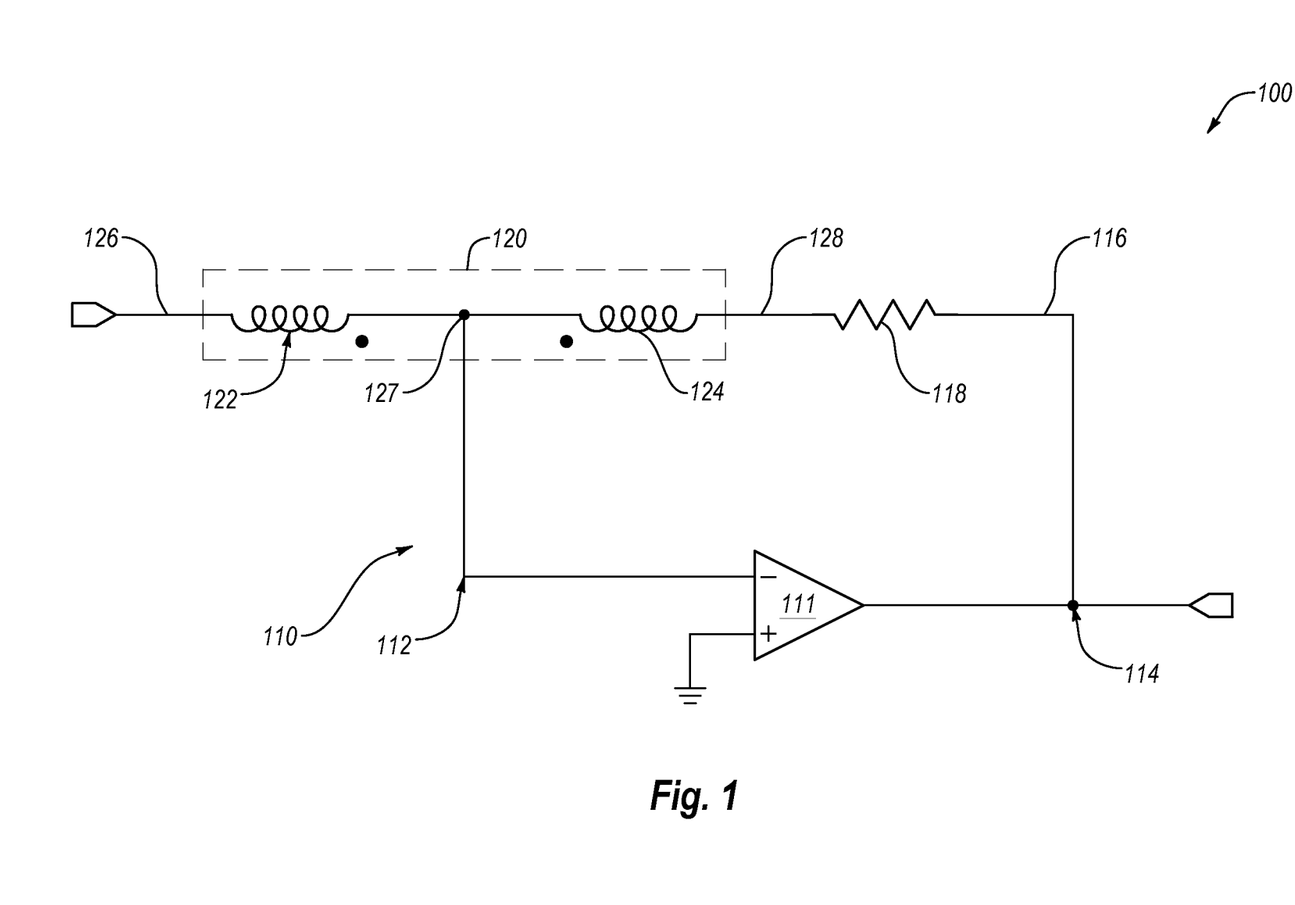
FIG. 1 is a circuit diagram of an example circuit with an improved bandwidth.

FIG. 1 is a circuit diagram of an example circuit 100 with an improved bandwidth, arranged in accordance with at least one embodiment described herein. The circuit 100 may include an amplifying circuit 110 and a t-coil inductor 120.

The amplifying circuit 110 may include an amplifier 111, an input node 112, an output node 114, and a feedback loop 116. The amplifier 111 may be an inverting amplifier that is coupled between the input node 112 and the output node 114. As an inverting amplifier, the amplifier 111 may have an inverting input coupled to the input node 112 and a non-inverting input coupled to ground. In this configuration, the amplifier 111 may be configured such that a voltage increase at its input results in a voltage decrease at its output. The feedback loop 116 may also be coupled between the input node 112 and the output node 114. The feedback loop 116 may include a resistance 118, such as one or more resistors or other components that offer resistance, such as a transistor operating in the linear region.

The amplifying circuit 110 may be configured as a transimpedance amplifying circuit. In these and other embodiments, the amplifying circuit 110 may be configured to receive a current signal at the input node 112 and to output a voltage signal on the output node 114 that is based on the current signal and a gain or amplification factor of the amplifying circuit 110. The amplifying circuit 110 may convert the current signal at the input node 112 to the voltage signal at the output node 114 using the resistance 118 in the feedback loop 116. In short, a current related to the current signal passing through the resistance 118 generates the voltage signal at the output node 114. In some embodiments, the gain of the amplifying circuit 110 may be positive, negative, or zero.

The t-coil inductor 120 may include first, second, and third nodes 126, 127, and 128. The t-coil inductor 120 may include a first portion 122 between the first and second nodes 126 and 127 and a second portion 124 between the second and third nodes 127 and 128. The first portion 122 and the second portion 124 may be magnetically coupled. In some embodiments, the first portion 122 and the second portion 124 may be formed by a single inductive structure. In some embodiments, the inductances of the first portion 122 and the second portion 124 may be substantially the same or different. In some embodiments, the t-coil inductor 120 may be monolithic.

The first node 126 may be configured to receive a current signal that may be converted by the amplifying circuit 110 into the voltage signal output on the output node 114. The second node 127 may be coupled to the input node 112 of the amplifying circuit 110. The third node 128 may be part of the feedback loop 116 of the amplifying circuit 110. In these and other embodiments, the second portion 124 of the t-coil inductor 120 may be included as part of the feedback loop 116 of the amplifying circuit 110.

Combining the amplifying circuit 110 and the t-coil inductor 120 as described may result in benefits for the amplifying circuit 110. For example, the t-coil inductor 120 may help to extend an input impedance bandwidth of the amplifying circuit 110. In particular, the first portion 122 may be coupled in series between the first node 126, which may be an input of the circuit 100, and the input node 112. Coupling the first portion 122 in series with the input node 112 may help to extend the input impedance bandwidth of the amplifying circuit 110. Extending the input impedance bandwidth may help to maintain an input impedance at a specified value over a larger range of frequencies.

The first portion 122 may help to extend the input impedance bandwidth of the amplifying circuit 110 by helping to reduce an effect that parasitic capacitance has at the input node 112 of the amplifying circuit 110. Alternately or additionally, the first portion 122 may help to extend the input impedance bandwidth of the amplifying circuit 110 by maintaining the impedance looking into the first node 126 and the input node 112 of the amplifying circuit 110 at higher frequency such that the input impedance does not change and result in reflections between the first node 126 and a trace coupled to the first node 126. For example, in some circumstances if the circuit 100 did not include the first portion 122, the impedance of the input node 112 may decrease at higher frequencies, resulting in an impedance mismatch between the input node 112 and a trace coupled to the input node 112. The impedance mismatch may result in reflections. With the first portion 122 coupled to the input node 112, at higher frequencies, the impedance of the first portion 122 may increase at a high frequency range, thereby compensating for other decreases in impedance at the high frequency range at the input node 112. The high frequency range may include frequencies higher than 500 megahertz (MHz), 1 gigahertz (GHz), 2 GHz, 5 GHz, 10 GHz, 20 GHz, 40 GHz, or higher depending on the construction of the amplifying circuit 100 and the implementation that includes the circuit 100. The impedance of the first portion 122 increasing may result in the input impedance of the amplifying circuit 110 maintaining stable at higher frequencies and thereby extending the input impedance of the amplifying circuit 110.

Combining the amplifying circuit 110 and the t-coil inductor 120 as described may also help to extend a transimpedance bandwidth of the amplifying circuit 110. In particular, the second portion 124 of the t-coil inductor 120 may help to extend the transimpedance bandwidth of the amplifying circuit 110. The transimpedance bandwidth of the amplifying circuit 110 may relate to the frequencies at which changes in the current signal at the input node 112 result in similar changes in the output voltage signal at the output node 114. The transimpedance bandwidth may be a result of parasitic capacitances of the amplifying circuit 110 and the circuit 100, including the parasitic capacitances at the first node 126, the input node 112, and the output node 114. At higher frequencies, the impedance of the feedback loop 116 without the second portion 124 may reduce resulting in a change in current in the feedback loop 116 not generating a similar change in the voltage across the feedback loop 116 and thus not resulting in a change in the output voltage signal. The impedance of the second portion 124, however, increases at higher frequencies to help offset reduction of the impedance of the parasitic capacitances of the amplifying circuit 110 and the circuit 100. By maintaining a similar impedance in the amplifying circuit 110 and the circuit 100, and thus the feedback loop 116, at higher frequencies, the amplifying circuit 110 may operate to convert the current signal to the voltage signal in a similar manner at the higher frequencies as the amplifying circuit 110 operates at lower frequencies, thereby extending the transimpedance bandwidth of the amplifying circuit 110.

In some embodiments, it may be advantageous to have an inductance of each of the first and second portions 122 and 124 be approximately equal during operation of the circuit 100. Due to the second portion 124 being within the feedback loop 116 of the amplifying circuit 110, the operating inductance, referred to herein as the effective inductance, of the second portion 124 may be reduced from the actual inductance of the second portion 124 during operation of the amplifying circuit 110. In some embodiments, the t-coil inductor 120 may be configured such that the effective inductance of the second portion 124 is approximately equal to the effective inductance of the first portion 122 during operation of the amplifying circuit 110 by having the actual inductance of the first portion 122 be larger than the actual inductance of the second portion 124.

Modifications, additions, or omissions may be made to the circuit 100 without departing from the scope of the present disclosure. For example, in some embodiments, one or more active components, such as transistors and diodes, or passive components, such as resistors, capacitors, and inductors, may be part of the circuit 100. For example, a diode may be coupled to the input node 112 or the first node 126 for electrostatic discharge protection.

Figure 2A:
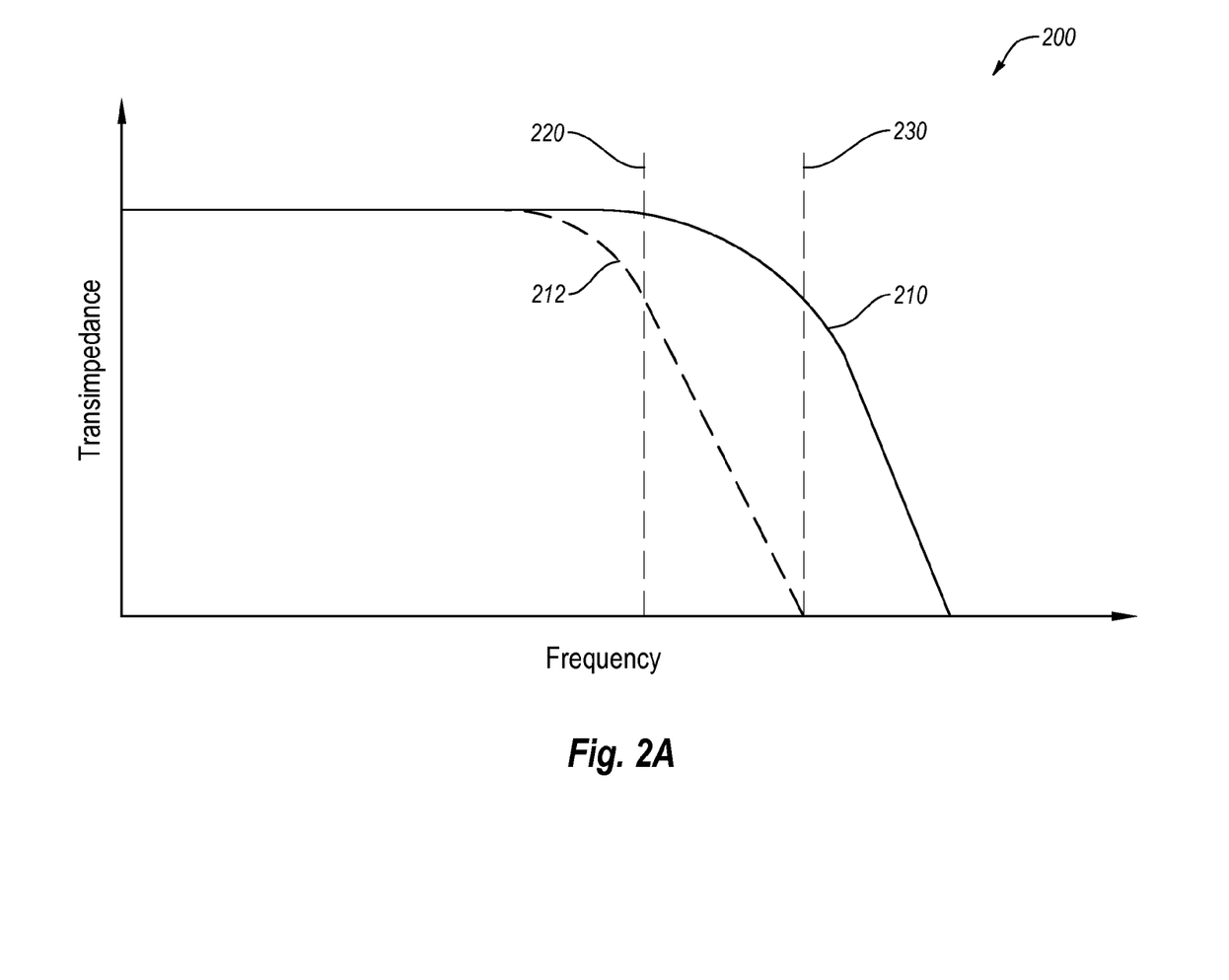
FIGS. 2A and 2B are graphs that illustrate various characteristics of the example circuit of FIG. 1.

FIG. 2A is a graph 200 that illustrates a characteristic of the example circuit 100 of FIG. 1, in accordance with at least one embodiment described herein. The graph 200 has an x-axis that represents a frequency of a signal received by the amplifying circuit 110. The graph 200 has a y-axis that represents a magnitude of the transimpedance of the amplifying circuit 110. The line 210 represents a magnitude of the transimpedance of the amplifying circuit 110 with respect to frequency when the circuit 100 includes the t-coil inductor 120. The line 212 represents a magnitude of the input impedance of the amplifying circuit 110 with respect to frequency when the circuit 100 does not include the t-coil inductor 120.

For example, at a first frequency 220, if the circuit 100 does not include the t-coil inductor 120, then the transimpedance of the amplifying circuit 110 may decrease below a minimum acceptable value as illustrated by line 212. When the circuit 110 includes the t-coil inductor 120, then the bandwidth of the transimpedance of the amplifying circuit 110 may be extended as illustrated by line 210. In particular, as illustrated in FIG. 2A, the bandwidth of the transimpedance may be extended to a second frequency 230 before the transimpedance of the amplifying circuit 110 decreases below the minimum acceptable value.

Figure 2B:
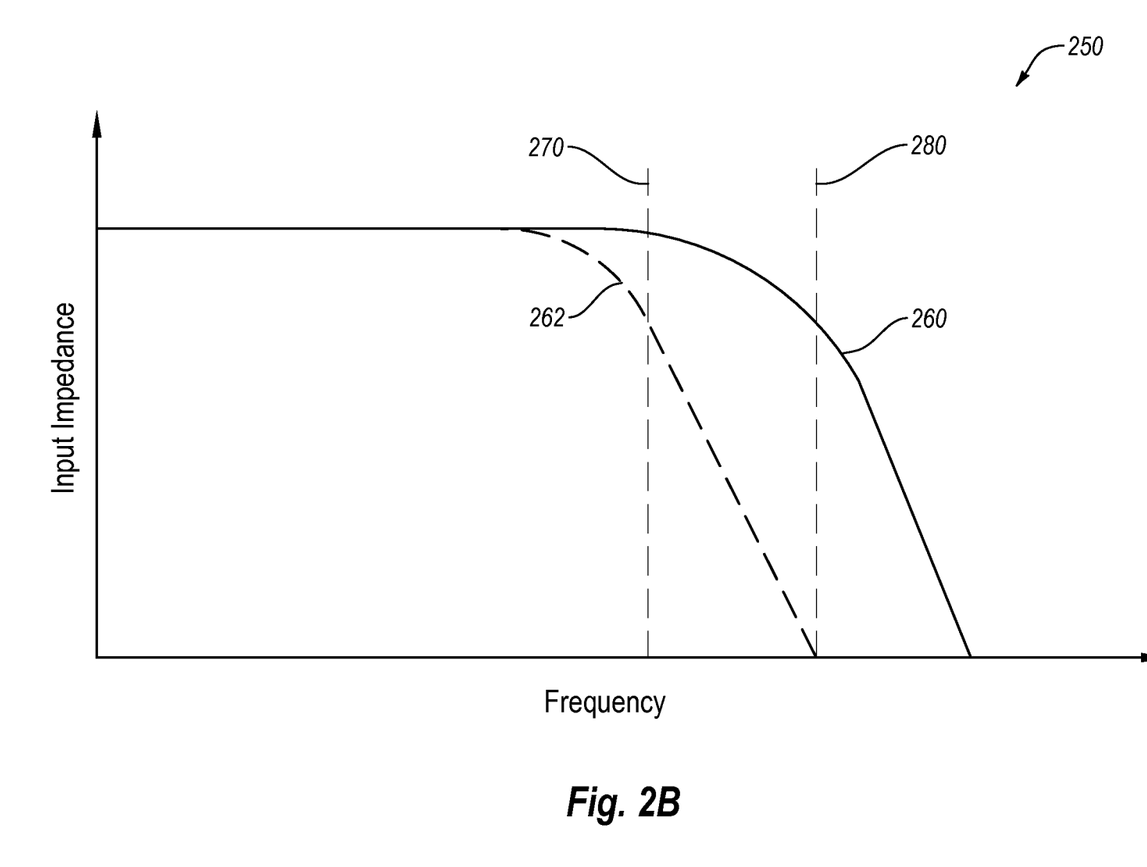

FIG. 2B is a graph 250 that illustrates a characteristic of the example circuit 100 of FIG. 1, in accordance with at least one embodiment described herein. The graph 250 has an x-axis that represents a frequency of a signal received by the amplifying circuit 110. The graph 250 has y-axis that represents a magnitude of the input impedance of the amplifying circuit 110. The line 260 represents a magnitude of the input impedance of the amplifying circuit 110 with respect to frequency when the circuit 100 includes the t-coil inductor 120. The line 262 represents a magnitude of the input impedance of the amplifying circuit 110 with respect to frequency when the circuit 100 does not include the t-coil inductor 120.

For example, at a first frequency 270, if the circuit 100 does not include the t-coil inductor 120, then input impedance of the amplifying circuit 110 may decrease below a minimum acceptable value as illustrated by line 262. When the circuit 100 includes the t-coil inductor 120, then the bandwidth of input impedance of the amplifying circuit 110 may be extended as illustrated by line 260. In particular, as illustrated in FIG. 2B, the bandwidth of the input impedance may be extended to a second frequency 280 before the input impedance decreases below the minimum acceptable value.

Figure 3:
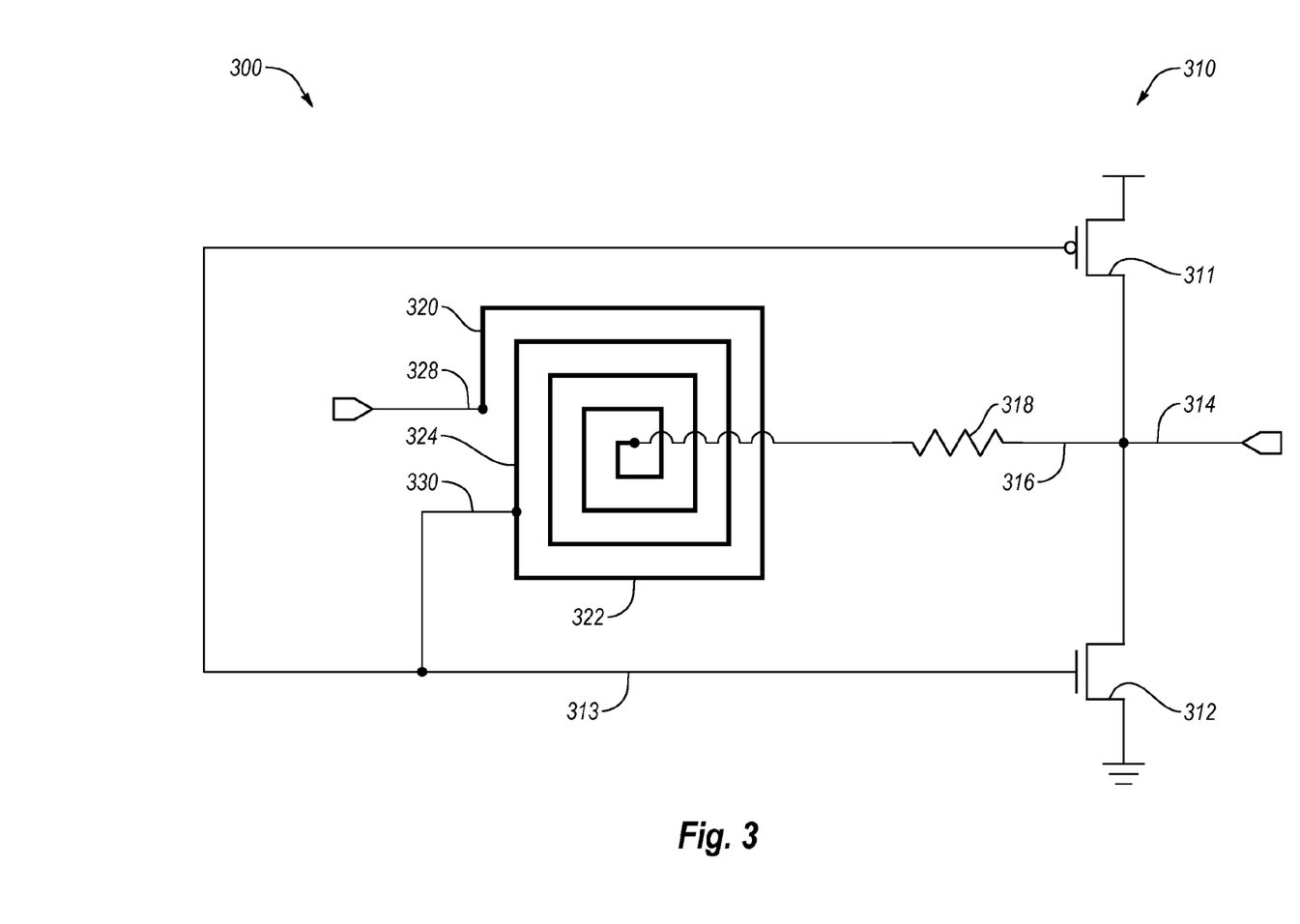
FIG. 3 is a circuit diagram of another example circuit with an improved bandwidth.

FIG. 3 is a circuit diagram of another example circuit 300 with an improved bandwidth, arranged in accordance with at least one embodiment described herein. The circuit 300 may include an amplifying circuit 310 and a t-coil inductor 320.

The amplifying circuit 310 may be configured as a transimpedance amplifier. In particular, the amplifying circuit 310 may be configured as an inverting transimpedance amplifier. The amplifying circuit 310 may include a first transistor 311, a second transistor 312, an input node 313, an output node 314, and a feedback loop 316. The first and second transistors 311 and 312 may form an inverting amplifier that couples the input node 313 and the output node 314. The feedback loop 116 may also couple the input node 313 to the output node 314. The feedback loop 316 may include a resistance 318, such as one or more resistors or other components that offer resistance, such as a body of a transistor.

The first transistor 311 may be a p-channel metal-oxide-semiconductor field effect transistors (MOSFET) or some other type of p-channel type transistor. The second transistor 312 may be an n-channel MOSFET or some other type of n-channel type transistor The gates of the first and second transistors 311 and 312 may be coupled to the input node 313. The sources of the first and second transistors 311 and 312 may be coupled to the output node 314. The drain of the first transistor 311 may be coupled to a voltage. The drain of the second transistor 312 may be coupled to ground.

As illustrated in FIG. 3, the t-coil inductor 320 may have a monolithic construction. Having a monolithic construction, the t-coil inductor 320 may be a single continuous conductive layer coupled between a signal input 328 for the circuit 300 and feedback loop 316. The signal input 328 may be a node in the circuit 300 configured to receive current signals directed to the amplifying circuit 310. The t-coil inductor 320 may also include a tap 330 that may be coupled to the input node 313.

The portion of the t-coil inductor 320 between the signal input 328 and the tap 330 may be a first portion 322. The first portion 322 may be before the input node 313 of the amplifying circuit 310 and may help to increase an input impedance bandwidth of the amplifying circuit 310.

The portion of the t-coil inductor 320 between the tap 330 and the resistance 318 may be a second portion 324. The second portion 324 may be part of the feedback loop 316 and may help to increase a transimpedance bandwidth of the amplifying circuit 310.

The actual inductance of each of the first portion 322 and the second portion 324 may depend on the length of each of the first portion 322 and the second portion 324, the position of the first portion 322 and the second portion 324 with respect to each other, the configuration of each of the first and second portions 322 and 324, and coupling between the first and second portions 322 and 324 and other components in the circuit 300.

In some embodiments, the second portion 324 may have an actual inductance that is higher than the first portion 322. The difference between the inductance of the first and second portions 322 and 324 may be such that the effective inductance of the first and second portions 322 and 324 during operation of the circuit 300 is approximately the same due to the effective inductance of the second portion 324 being different than the actual inductance of the second portion 324.

Modifications, additions, or omissions may be made to the circuit 300 without departing from the scope of the present disclosure. For example, in some embodiments, the amplifying circuit 310 may include more than the first and second transistors 311 and 312. For example, the amplifying circuit 310 may include multiple other transistors coupled to the first and second transistors 311 and 312 that are configured to provide operation analogous to the operation of the first and second transistors 311 and 312. For example, additional transistors may be used by the amplifying circuit 310 to form a cascode amplifying circuit 310. Alternately or additionally, the single continuous conductive layer of the t-coil inductor 320 may be formed to have a different shape than the square type looping shape illustrated in FIG. 3. For example, the shape of the single continuous conductive layer of the t-coil inductor 320 may be circular, octagonal, hexagonal, pentagonal, rectangular, or triangular, among others.

Figure 4:
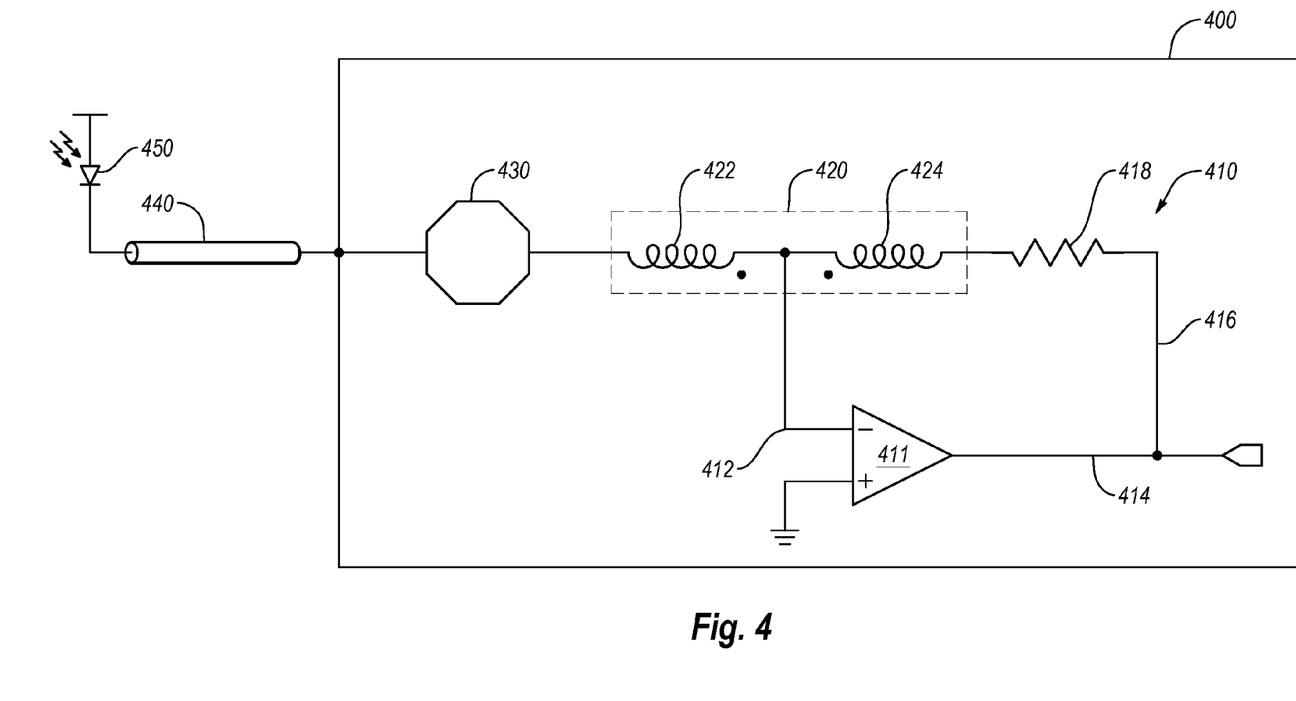
FIG. 4 is a circuit diagram of an integrated circuit that includes an example amplifying circuit with an improved bandwidth.

FIG. 4 is a circuit diagram of an integrated circuit 400 that includes an example amplifying circuit 410 with an improved bandwidth, arranged in accordance with at least one embodiment described herein. The integrated circuit 400 may include the amplifying circuit 410, a t-coil inductor 420, and a pad 430.

The amplifying circuit 410 may include an amplifier 411, an input node 412, an output node 414, and a feedback loop 416. The amplifier 411 may be an inverting amplifier that is coupled between the input node 412 and the output node 414. As an inverting amplifier, the amplifier 411 may have an inverting input coupled to the input node 412 and a non-inverting input coupled to ground. In this configuration, the amplifier 411 may be configured such that a voltage increase at its input results in a voltage decrease at its output.

The feedback loop 116 may also be coupled between the input node 412 and the output node 414. The feedback loop 416 may include a resistance 418. The t-coil inductor 420 may include a first portion 422 coupled between the pad 430 and the input node 412 and a second portion 424 coupled in the feedback loop 416 between the resistance 418 and the input node 412. The amplifying circuit 410 and the t-coil inductor 420 may operate in a manner analogous to the amplifying circuit 110 and the t-coil inductor 120 of FIG. 1. As such, no further description of their operation is provided with respect to FIG. 4.

In FIG. 4, the amplifying circuit 410 and the t-coil inductor 420 may be formed as part of the integrated circuit 400. As such, the amplifying circuit 410 and the t-coil inductor 420 may be formed together on a single substrate during construction of the integrated circuit 400.

The pad 430 in the integrated circuit 400 may be configured to couple the integrated circuit 400 to other circuits, traces, signals, components, or similar items. For example, the pad 430 may be used to couple the integrated circuit 400 to a printed circuit board (PCB) or some other device using a solder flow. In some embodiments, the pad 430 may be a conductive material, such as a metal. As illustrated, the pad 430 may be coupled to a trace 440. The trace 440 may be coupled to a photodiode 450. The photodiode 450 may be configured to generate a current signal based on received illumination. The current signal may pass through the trace 440 to the pad 430. The pad 430 may provide the current signal to the first portion 422, which may pass the current signal to the amplifying circuit 410 for conversion to a voltage signal as described herein.

In some embodiments, the trace 440 may be long enough to behave as a transmission line with a certain characteristic impedance. For example, the trace 440 may have a characteristic impedance of 50, 60, 75, 90, or 100 ohms, or some other impedance. In these and other embodiments, an inductance of the first portion 422 may be selected to offset the capacitance of the pad 430 to improve the input impedance bandwidth of the amplifying circuit 410. Alternately or additionally, the inductance of the first portion 422 may be selected in relation to the capacitance and other characteristics of the pad 430 such that an input impedance of the amplifying circuit 410 is approximately equal to the characteristic impedance of the trace 440. By selecting the input impedance of the amplifying circuit 410 to be approximately equal to the characteristic impedance of the trace 440, a number of reflections of the current signal generated by coupling the integrated circuit 400 to the trace 440 may be reduced. Reducing the number of reflections may increase a signal integrity or a signal-to-noise ratio, among other aspects of the current signal generated by the photodiode 450.

Modifications, additions, or omissions may be made to the circuit 400 without departing from the scope of the present disclosure. For example, in some embodiments, another component other than a photodiode 450 may be configured to generate a current signal that is provided to the integrated circuit 400 by the trace 440.

Figure 5:
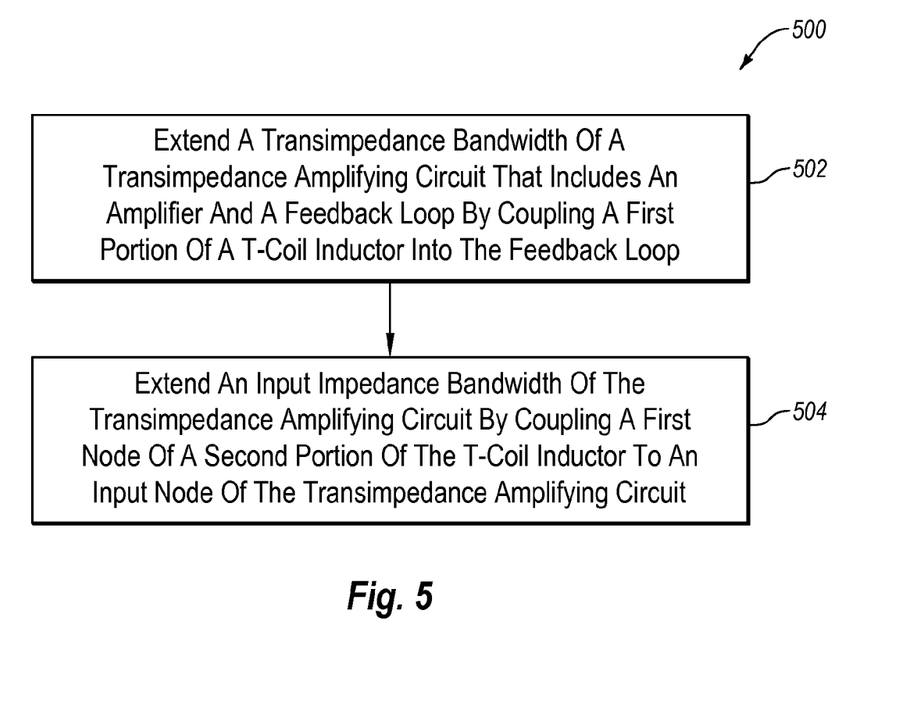
FIG. 5 is a flowchart of an example method of improving a bandwidth of an amplifying circuit.

FIG. 5 is a flowchart of an example method 500 of improving a bandwidth of an amplifier, arranged in accordance with at least one embodiment described herein. The method 500 may be implemented, in some embodiments, by a circuit, such as the circuits 100, 300, or 400 of FIGS. 1, 3, and 4, respectively. Although illustrated as discrete blocks, various blocks may be divided into additional blocks, combined into fewer blocks, or eliminated, depending on the desired implementation.

The method 500 may begin at block 502, where a transimpedance bandwidth of a transimpedance amplifying circuit that includes an amplifier and a feedback loop may be extended by coupling a first portion of a t-coil inductor into the feedback loop.

In block 504, an input impedance bandwidth of the transimpedance amplifying circuit may be extended by coupling a first node of a second portion of the t-coil inductor to an input node of the transimpedance amplifying circuit.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, the method 500 may further include selecting an inductance of the first portion of the t-coil inductor to be more than an inductance of the second portion of the t-coil inductor. In some embodiments, selecting an inductance of the first portion of the t-coil inductor to be more than an inductance of the second portion of the t-coil inductor may include setting the inductance of the first portion of the t-coil inductor such that an effective inductance of the first portion of the t-coil inductor may be approximately equal to the effective inductance of the second portion of the t-coil inductor.

Alternately or additionally, the method 500 may further include selecting an inductance of the second portion of the t-coil inductor such that an input impedance of the input node of the transimpedance amplifying circuit may be approximately equal to a characteristic impedance of a trace coupled to a second node of the second portion of the t-coil inductor.

All examples and conditional language recited herein are intended as pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit comprising:
an amplifying circuit including an input node, an output node, an amplifier coupled between the input node and the output node, and a feedback loop coupled between the input node and the output node, the amplifying circuit configured to receive a current signal on the input node and to output a voltage signal based on the current signal on the output node; and
a t-coil inductor including a first node, a second node, a third node, and a continuous conductive layer coupled between the first node and the second node, wherein the third node is coupled to the continuous conductive layer between the first node and the second node to define a first portion between the first node and the third node and a second portion between the third node and the second node and the third node is coupled to the input node of the amplifying circuit and the second portion is included in the feedback loop.

2. The circuit of claim 1, wherein the feedback loop further includes a resistance.

3. The circuit of claim 1, wherein an inductance of the first portion is not substantially equal to an inductance of the second portion.

4. The circuit of claim 1, wherein the amplifier is an inverting amplifier.

5. The circuit of claim 3, wherein an effective inductance of the first portion is substantially equal to an effective inductance of the second portion.

6. The circuit of claim 1, wherein an inductance of the second portion is configured to extend a transimpedance bandwidth of the amplifying circuit and an inductance of the first portion is configured to extend an input impedance bandwidth of the amplifying circuit.

7. The circuit of claim 1, wherein the t-coil inductor is monolithic.

8. The circuit of claim 1, wherein the amplifying circuit and the t-coil inductor are formed in an integrated circuit.

9. The circuit of claim 8, wherein the integrated circuit includes a pad for coupling the integrated circuit to a trace, wherein the first node of the t-coil inductor is coupled to the pad and an inductance of the first portion is selected such that an input impedance of the amplifying circuit is approximately equal to a characteristic impedance of the trace.

10. An integrated circuit comprising:
   a pad configured to couple the integrated circuit to a trace outside the integrated circuit;
   a transimpedance amplifying circuit including an input node, an output node, an amplifier coupled between the input node and the output node, and a feedback loop coupled between the input node and the output node; and
   a t-coil inductor including first, second, and third nodes, and a continuous conductive layer coupled between the first node and the third node, wherein the second node is coupled to the continuous conductive layer between the first node and the third node to define a first portion between the first node and the second node and to define a second portion between the second node and the third node, wherein the second node is coupled to the input node of the transimpedance amplifying circuit, the third node is coupled to the pad, and the first node is within the feedback loop such that the first portion is included in the feedback loop.

11. The circuit of claim 10, wherein a resistance is coupled between the first node within the feedback loop and the output node.

12. The circuit of claim 10, wherein an inductance of the first portion is not substantially equal to an inductance of the second portion.

13. The circuit of claim 12, wherein the inductance of the second portion is larger than the inductance of the first portion.

14. The circuit of claim 13, wherein an inductance of the second portion is selected such that an input impedance of the transimpedance amplifying circuit is approximately equal to a characteristic impedance of a trace coupled to the third node.

15. The circuit of claim 10, wherein an inductance of the first portion is configured to extend a transimpedance bandwidth of the transimpedance amplifying circuit and an inductance of the second portion is configured to extend an input impedance of the transimpedance amplifying circuit.

16. A method of improving a bandwidth of an amplifying circuit, the method comprising:
   extending a transimpedance bandwidth of a transimpedance amplifying circuit that includes an amplifier and a feedback loop by coupling a first portion of a t-coil inductor into the feedback loop;
   extending an input impedance bandwidth of the transimpedance amplifying circuit by coupling a first node of a second portion of the t-coil inductor to an input node of the transimpedance amplifying circuit; and
   selecting an inductance of the first portion of the t-coil inductor to be more than an inductance of the second portion of the t-coil inductor such that an effective inductance of the first portion of the t-coil inductor at operating frequencies of the amplifying circuit is approximately equal to the effective inductance of the second portion of the t-coil inductor at operating frequencies of the amplifying circuit.

\* \* \* \* \*